(12) United States Patent
Jeng et al.

(10) Patent No.: US 9,601,446 B2
(45) Date of Patent: Mar. 21, 2017

(54) METHOD OF FABRICATING A BOND PAD STRUCTURE

(71) Applicant: Taiwan Semiconductor Manufacturing Company, Ltd., Hsin-Chu (TW)

(72) Inventors: Shin-Puu Jeng, Hsinchu (TW); Hsien-Wei Chen, Hsinchu (TW); Hao-Yi Tsai, Hsinchu (TW); Yu-Wen Liu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 9 days.

(21) Appl. No.: 14/657,789

(22) Filed: Mar. 13, 2015

(65) Prior Publication Data

US 2015/0194397 A1 Jul. 9, 2015

Related U.S. Application Data

(62) Division of application No. 13/463,433, filed on May 3, 2012, now Pat. No. 8,981,580, which is a division
(Continued)

(51) Int. Cl.
*H01L 29/40* (2006.01)
*H01L 23/00* (2006.01)

(52) U.S. Cl.
CPC .............. *H01L 24/03* (2013.01); *H01L 24/05* (2013.01); *H01L 2224/02166* (2013.01); *H01L 2224/0401* (2013.01); *H01L 2224/05093* (2013.01); *H01L 2224/05096* (2013.01); *H01L 2224/05124* (2013.01); *H01L 2224/05147* (2013.01); *H01L 2224/05166* (2013.01); *H01L 2224/05181* (2013.01); *H01L 2224/05184* (2013.01); *H01L 2224/05187* (2013.01); *H01L 2224/05552* (2013.01); *H01L 2224/05556* (2013.01); *H01L 2224/05558* (2013.01); *H01L 2224/05624* (2013.01); *H01L 2224/16* (2013.01); *H01L 2224/85201* (2013.01); *H01L 2224/85205* (2013.01); *H01L 2924/01006* (2013.01);
(Continued)

(58) Field of Classification Search
CPC ........................................................ H01L 24/03
USPC ........................................................ 257/786
See application file for complete search history.

(56) References Cited

U.S. PATENT DOCUMENTS

2006/0267222 A1* 11/2006 Saito .................... H01L 24/03
257/786

* cited by examiner

*Primary Examiner* — Jerome Jackson, Jr.
(74) *Attorney, Agent, or Firm* — Haynes and Boone, LLP

(57) ABSTRACT

A method of forming a bond pad structure is provided. The method includes forming a first conductive layer over a substrate and depositing a first dielectric layer over the first conductive layer. The first dielectric layer is patterned to form a contiguous planar path substantially parallel to a top surface of the substrate. Patterning the first dielectric layer includes defining a dielectric region of the first dielectric layer surrounded by a portion of the contiguous planar path, and forming a first via hole in the dielectric region. The contiguous planar path and the via hole are filled with a conductive material. The conductive material in the contiguous planar path forms a second conductive layer, and the contiguous planar path extends from a first lateral side wall of the second conductive layer to a second lateral sidewall of the second conductive layer. A bond pad is formed over the second conductive layer, and the bond pad is electrically connected to the second conductive layer.

20 Claims, 5 Drawing Sheets

Related U.S. Application Data of application No. 12/026,312, filed on Feb. 5, 2008, now Pat. No. 8,178,980.

(52) U.S. Cl.
CPC ............... *H01L 2924/01013* (2013.01); *H01L 2924/01014* (2013.01); *H01L 2924/01019* (2013.01); *H01L 2924/01022* (2013.01); *H01L 2924/01027* (2013.01); *H01L 2924/01028* (2013.01); *H01L 2924/01029* (2013.01); *H01L 2924/01032* (2013.01); *H01L 2924/01033* (2013.01); *H01L 2924/01046* (2013.01); *H01L 2924/01049* (2013.01); *H01L 2924/01068* (2013.01); *H01L 2924/01073* (2013.01); *H01L 2924/01074* (2013.01); *H01L 2924/01078* (2013.01); *H01L 2924/01082* (2013.01); *H01L 2924/01087* (2013.01); *H01L 2924/04941* (2013.01); *H01L 2924/04953* (2013.01); *H01L 2924/05042* (2013.01); *H01L 2924/10253* (2013.01); *H01L 2924/10329* (2013.01); *H01L 2924/14* (2013.01); *H01L 2924/3011* (2013.01); *H01L 2924/30105* (2013.01); *H01L 2924/37001* (2013.01)

METHOD OF FABRICATING A BOND PAD STRUCTURE

CROSS REFERENCE

This application is a Divisional application of Ser. No. 13/463,433, filed May 3, 2012, which in turn is a Divisional application of Ser. No. 12/026,312, filed Feb. 5, 2008, now U.S. Pat. No. 8,178,980, entitled "Bond Pad Structure," the entire disclosures of both are incorporated herein by reference in their entirety.

BACKGROUND

This disclosure relates generally to integrated circuits, and more particularly to a bond pad structure.

Integrated circuits are typically formed on a substrate such as a semiconductor wafer. Bond pads (or bonding pads) are included on the substrate. A bond pad provides an interface to an integrated circuit device through which an electrical connection to the device may be made. Conventional techniques may be used to provide a connection from a package terminal to an integrated circuit using the bond pad such as, thermocompression or thermosonic wire bonding, flip chip techniques, and other techniques known in the art.

Interconnection techniques can cause mechanical stress to the bond pad structure and surrounding areas, for example, from the placement of a ball or wedge in wire bonding or a bump in flip chip techniques onto the bond pad. Additionally, in an electrical test procedure, a bond pad may be used to provide connection to an underlying integrated circuit device in order to analyze the device. The contact of a test probe during the test procedure can also cause mechanical stress to the bond pad structure. The stress from bonding, electrical test, as well as from other possible stress sources, may cause damage to the bond pad structure as well as the underlying layers. Examples of types of damage that may occur include cracking and delayering. The stress is particularly critical as semiconductor technology progresses because layers underlying the bond pad area, for example, interlayer dielectrics having a low dielectric constant, are becoming more and more fragile.

As such, an improved bond pad structure is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
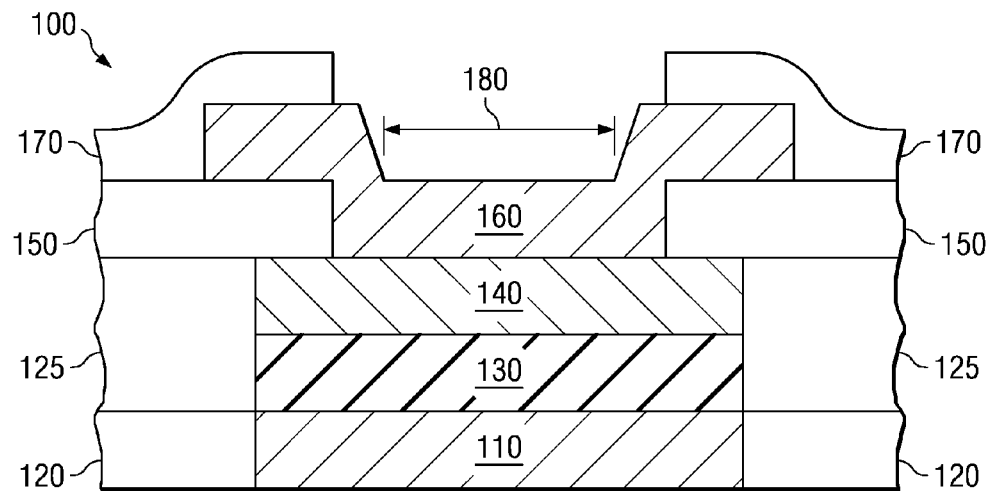
FIG. 1 is a sectional view of an embodiment of a bond pad structure.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Additionally, descriptive terms such as upper/lower, top/bottom, and vertical/horizontal are used for ease of description and do not provide any limitation to an absolute direction. For example, an upper layer and a lower layer may indicate a respective relationship relative to a substrate or integrated circuit formed on a substrate, rather than absolute direction.

Referring now to FIG. 1, illustrated is an embodiment of a bond pad structure (e.g., a bond pad and bond pad connections) 100. The bond pad structure 100 may be formed on a substrate including an integrated circuit or portion thereof. The substrate typically includes conductive, insulative, and semiconductor layers patterned to form an integrated circuit. The substrate may include an interconnect structure (e.g., multilayer interconnect (MLI) or a plurality of conductive traces and interlayer dielectric) to which the bond pad structure 100 is electrically connected. In an embodiment, the bond pad structure 100 includes a circuit under pad (CUP) structure. In a CUP structure, a bond pad may be disposed over active circuitry of an integrated circuit, or portion thereof. In an embodiment, the bond pad structure 100 is a CUP structure and is disposed over the input/output (I/O) cell of an integrated circuit. Advantages of CUP include shortening the conductors, thus decreasing their resistance and capacitance which may reduce the parasitic capacitance of the integrated circuit, and saving space.

The bond pad structure 100 includes a lower conductive layer 110, an intermediate conductive layer 130, an upper conductive layer 140, dielectric layers 120 and 125, passivation layers 150 and 170, and a bond pad 160. The lower conductive layer 110 may be electrically connected to and/or be a portion of, an interconnect structure (e.g., an MLI). The intermediate conductive layer 130 is disposed on the lower conductive layer 110 and the upper conductive layer 140 disposed on the intermediate conductive layer 130 such that the intermediate conductive layer 130 interposes the lower conductive layer 110 and the upper conductive layer 140. The intermediate conductive layer 130 provides an electrical connection between the upper conductive layer 140 and the lower conductive layer 110. In an embodiment, the lower conductive layer 110, the intermediate conductive layer 130, and/or the upper conductive layer 140 include copper. Examples of other materials suitable for use in the conductive layers 110, 130, and/or 140 include aluminum, aluminum/silicon/copper alloy, metal silicide (such as nickel silicide, cobalt silicide, tungsten silicide, tantalum silicide, titanium silicide, platinum silicide, erbium silicide, palladium silicide, or combinations thereof), copper, copper alloy, titanium, titanium nitride, tantalum, tantalum nitride, tungsten, polysilicon, and combinations thereof.

The upper conductive layer 140, the lower conductive layer 110, and/or the intermediate conductive layer 130 are illustrated as continuous structures of conductive material. In particular, the bond pad structure 100 includes the intermediate conductive layer 130 as a solid layer (e.g., pad) of conductive material. In other words, being a solid layer, the conductive density (e.g., the percentage of conductive material as compared to non-conductive material (e.g., dielectric)) of the intermediate conductive layer 130 is approximately 100%. Though the intermediate conductive layer 130 as illustrated includes a continuous, conductive structure, other embodiments are possible. For example, an intermediate layer may include any configuration of contiguous, conductive structure(s). A configuration of contiguous, conductive structure(s) may include a continuous structure, adjacent structures, and/or structures in close contact.

The upper conductive layer 140 is electrically coupled to the bond pad 160. In an embodiment, the bond pad 160 includes aluminum or aluminum alloy. Other examples of material suitable for the bond pad 160 include metals, metal alloys, metal silicides, and/or combinations thereof. The bond pad 160 may include one or more layers of conductive material (e.g., barrier layers). In one embodiment, the bonding pad has a horizontal dimension ranging between about 20 microns and about 200 microns for electrical testing (e.g., probe) and bonding.

The intermediate conductive layer 130 provides an electrical connection between the upper conductive layer 140 and the lower conductive layer 110. In effect, the intermediate conductive layer 130 provides an electrical connection between the bond pad 160 and an interconnect structure of an integrated circuit or portion thereof formed on the substrate. Conventionally, in place of the intermediate conductive layer 130, a via array may be used to provide electrical connection to a bond pad. However, use of a via array may allow bonding stress to result in de-layering. The intermediate conductive layer 130 may provide for improved distribution of mechanical stress as compared to the via array. In the illustrated embodiment, the interface of the intermediate conductive layer 130 and the upper conductive layer 140 is 100% conductive material. However, other embodiments are possible including, for example, the bond pad structure 300, described with reference to FIG. 3.

The bond pad structure 100 also includes the dielectric layers 120 and 125. In an embodiment, the dielectric layers 120 and 125 are unitary (e.g., a single dielectric layer). Examples of material suitable for the dielectric layers 120 and/or 125 include silicon oxide, a material having a low dielectric constant such as a dielectric constant (k) less than about 2.5 (e.g., extra low k (ELK)), silicon nitride, silicon oxynitride, polyimide, spin-on glass (SOG), fluoride-doped silicate glass (FSG), undoped silica glass (USG), carbon doped silicon oxide (SiOC), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. In an embodiment, the dielectric layer 120 includes ELK. The ELK layer may have a dielectric constant (k) of approximately 2.5. In an embodiment, the dielectric layer 125 includes USG.

The bond pad structure 100 also includes the passivation layers 150 and 170. The passivation layers 150 and/or 170 may include silicon oxide, silicon nitride, silicon oxynitride, and/or other suitable materials. The openings in the passivation layers 150 and 170 expose the bond pad 160 providing a bonding area 180. The bonding area 180 includes the area of the bond pad 160 available for bonding, for example, for placement of a ball, wedge, or bump.

Figure 2:
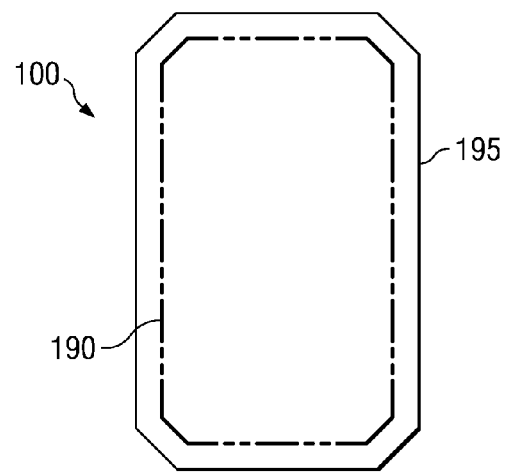
FIG. 2 is a corresponding top view of an embodiment of the bond pad structure of FIG. 1.
Figure 3:
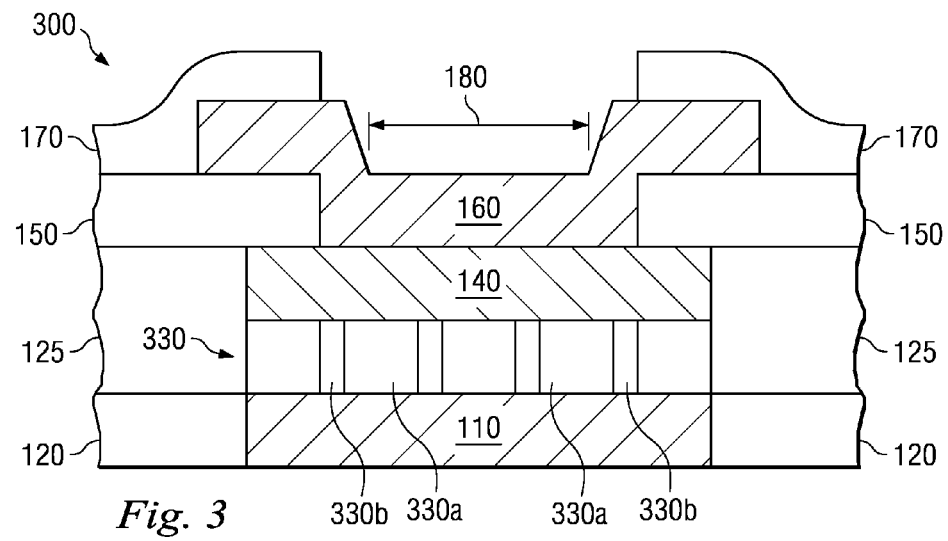
FIG. 3 is a sectional view of an alternative embodiment of a bond pad structure.

Referring now to FIG. 2, illustrated is a top view of the bond pad structure 100 including a passivation opening 190 and a conductive area 195. The passivation opening 190 illustrates the opening of passivation layers 150 and 170, described above with reference to FIG. 1. The conductive area 195 illustrates the presence of the lower conductive layer 110, the intermediate conductive layer 130, the upper conductive layer 140, and/or the bond pad 160. As illustrated by FIGS. 2 and 3, in an embodiment, the intermediate conductive layer 130 laterally extends wider than the passivation 170 and 150 openings.

Figure 4:
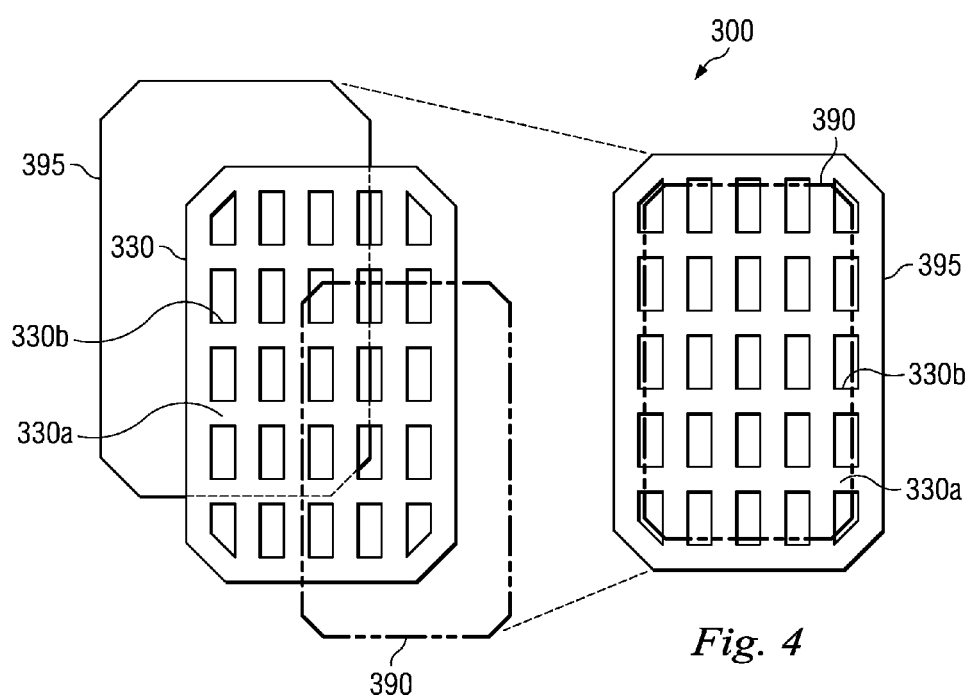
FIG. 4 is a corresponding top view of an embodiment of the bond pad structure of FIG. 3.

Referring now to FIGS. 3 and 4, illustrated is an embodiment of a bond pad structure 300. The bond pad structure 300 is similar to the bond pad structure 100, described above with reference to FIG. 1, except as described herein. For example, similar to the bond pad structure 100, the bond pad structure 300 may include a CUP structure. The bond pad structure 300 however includes an intermediate layer 330 interposed between the lower conductive layer 110 and the upper conductive layer 140. The intermediate layer 330 provides electrical connection between the lower conductive layer 110 and the upper conductive layer 140. The intermediate layer 330 includes a conductive network 330a and a plurality of spacers 330b. The conductive network 330a includes a contiguous, conductive structure. In an embodiment, the conductive network 330a is a continuous, conductive structure. The spacers 330b may be of uniform or non-uniform dimensions.

In an embodiment, the conductive network 330a includes copper. Examples of other materials suitable for inclusion in the conductive network 330a include aluminum, aluminum/silicon/copper alloy, metal silicide (such as nickel silicide, cobalt silicide, tungsten silicide, tantalum silicide, titanium silicide, platinum silicide, erbium silicide, palladium silicide, or combinations thereof), copper, copper alloy, titanium, titanium nitride, tantalum, tantalum nitride, tungsten, polysilicon, and combinations thereof. The spacers 330b include a dielectric material. The spacers 330b may include the same dielectric composition as the dielectric layer 125. In an embodiment, the spacers 330b include USG. Examples of other materials suitable for inclusion in the spacers 330b include silicon oxide, a material having a low dielectric constant such as a dielectric constant less than about 2.5, silicon nitride, silicon oxynitride, polyimide, spin-on glass (SOG), fluoride-doped silicate glass (FSG), carbon doped silicon oxide (SiOC), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. In an embodiment, one or more conductive plugs may be formed in vias in the spacers 330b, such as described in reference to FIG. 6.

The conductive network 330a may include any configuration of conductive material such that an electrical connection is provided between the upper conductive layer 140 and the lower conductive layer 110. As such, the conductive network 330a provides a conductive path from an upper interface (e.g., with the upper conductive layer 140) to a lower interface (e.g., with the lower conductive layer 110) (e.g., the layer is vertically continuous). The conductive network 330a may be configured as a mesh configuration, a lattice configuration, a grid configuration, and/or a plurality of conductive lines (e.g., stripes). In an embodiment, the intermediate layer 330 includes a contiguous conductive network 330a. In a further embodiment, conductive network 330a is continuous conductive structure such that an uninterrupted path of conductive material may be traced from one sidewall of the intermediate layer 330 to the other sidewall of the intermediate layer 330 (e.g., horizontally continuous). It should be noted that the terms horizontal and vertical are not meant to imply a direction but a relative position with respect to the upper and lower conductive layers 140 and 110. The intermediate layer 330 includes a conductive density of approximately 20% to 100%. In other words, the percentage of conductive material (e.g., in the conductive network 330a) in relation to non-conductive (e.g., in the spacers 330b) is between approximately 20% and 100%. In an embodiment, approximately 20% to 100% of the surface area of the interface between the intermediate layer 330 and the upper and/or lower conductive layers 110 and/or 140 includes the conductive network 330a.

FIG. 4 illustrates a top view of the bond pad structure 300. The top view illustrates a passivation opening 390, a conductive area 395, and the intermediate conductive layer 330 including the conductive network 330a and the spacers 330b. The passivation opening 390 refers to the opening of passivation layers 150 and 170. The conductive area 395 refers to the presence of the lower conductive layer 110, the upper conductive layer 140, and/or the bond pad 160. As illustrated by FIGS. 3 and 4, in an embodiment, the intermediate conductive layer 330 including the conductive network 330a extends beyond the passivation opening 390.

Figure 5:
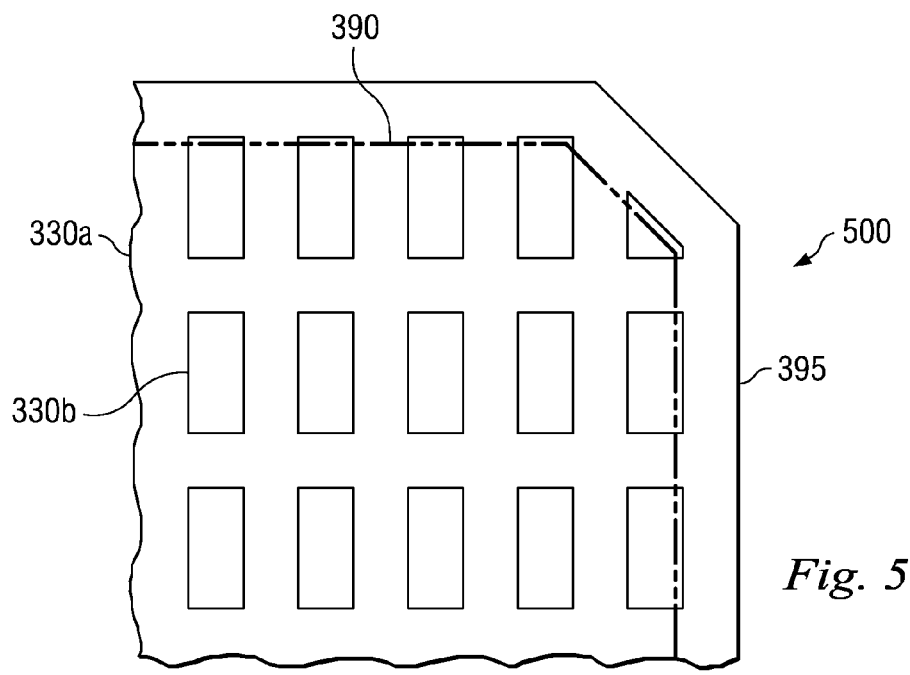
FIG. 5 is a top view of an embodiment of a bond pad structure including a conductive network.
Figure 6:
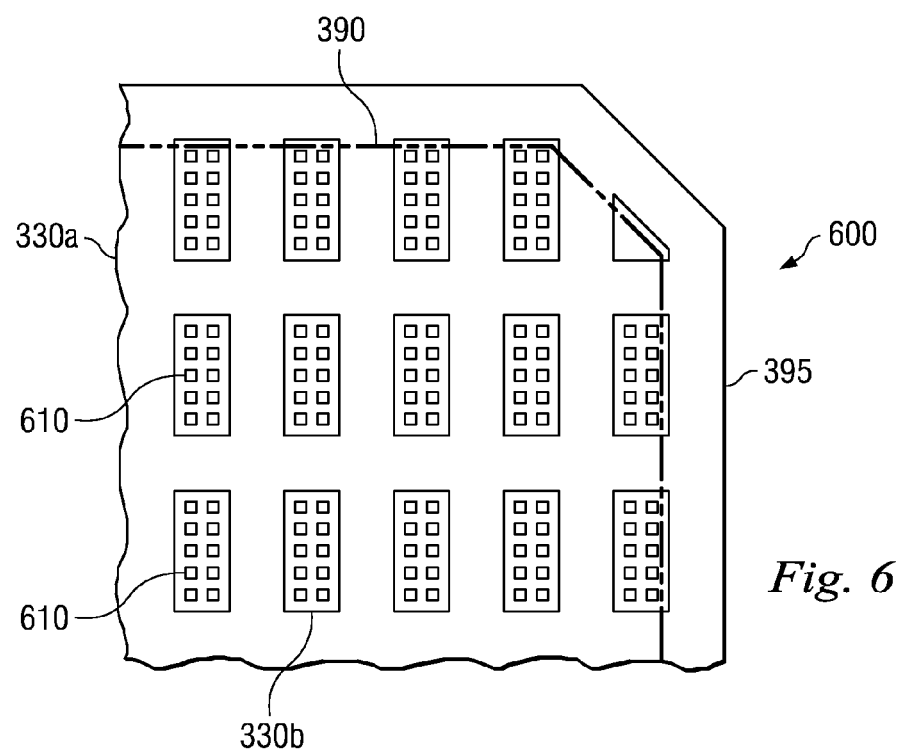
FIG. 6 is a top view of an embodiment of a bond pad structure including a conductive network and conductive plugs.

Referring now to FIGS. 5 and 6 illustrated are top views of embodiments of portions of bond pad structures. In particular a bond pad structure 500, illustrated in FIG. 5, and a bond pad structure 600, illustrated in FIG. 6, are illustrative of exemplary embodiments of the intermediate layer 330. The bond pad structures 500 and 600 illustrate the passivation opening 390 and the conductive area 395, described above with reference to FIG. 4. Also illustrated are the conductive network 330a and the spacers 330b. The bond pad structure 500 includes the conductive network 330a which is a continuous, conductive structure including a mesh configuration. The bond pad structure 600 illustrates also the intermediate layer 330 including the conductive network 330a having a mesh configuration. In the bond pad structure 600, a plurality of conductive plugs 610 are formed in vias of the spacers 330b. The conductive plugs 610 may provide electrical connection between the upper conductive layer 140 and the lower conductive layer 110. Each of the conductive plugs 610 may be a discrete structure. The bond pad structures 500 and 600 are intended for illustrative purposes only and not intended to be limiting in any manner. Though illustrated as including conductive networks including a mesh structure being a continuous, conductive structure, other embodiments may include any contiguous, conductive structure or structures. For example, in one embodiment, the intermediate layer may include a plurality of structures (e.g., conductive lines such as stripes, or a plurality of matrix configurations) being contiguous, conductive structures such that one or more conductive structures are adjacent.

Figure 7:
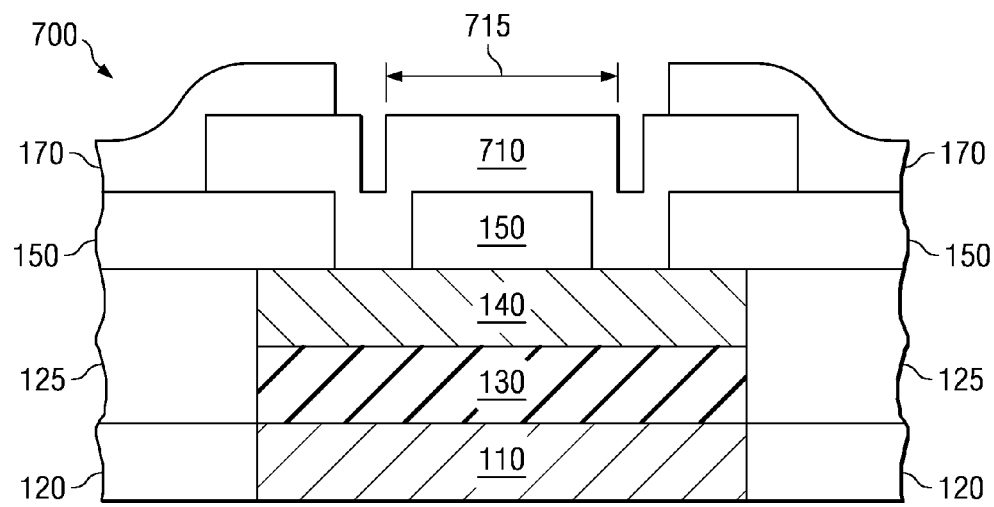
FIG. 7 is a sectional view of an alternative embodiment of a bond pad structure.
Figure 8:
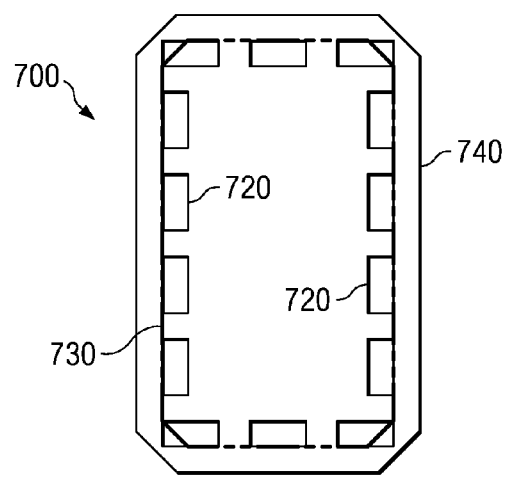
FIG. 8 is a corresponding top view of an embodiment of the bond pad structure of FIG. 7.

Referring now to FIGS. 7 and 8, illustrated is an embodiment of a bond pad structure 700. The bond pad structure 700 is similar to the bond pad structure 100 except as herein described. For example, similar to the bond pad structure 100 of FIG. 1, the bond pad structure 700 may include a CUP structure. The bond pad structure 700 includes the lower conductive layer 110, the intermediate conductive layer 130, and the upper conductive layer 140 similar to as described above with reference to FIG. 1. Though illustrated as including the intermediate conductive layer 130 having a conductive density of 100% (e.g., solid pad), in other embodiments, the bond pad structure 700 includes an intermediate layer such as the intermediate layer 330, described above with reference to FIGS. 3, 4, 5, and 6. The intermediate layer may have a conductive density less than 100% and may include any configuration of a contiguous, conductive structure. The bond pad structure 700 includes a bond pad 710. The bond pad 710 is connected to the upper conductive layer 140 by conductive studs 710a in the periphery area of the bond pad 710. The passivation layer 150 is formed under a portion of the bond pad 710.

Referring in particular to FIG. 8, illustrated is a top view of the bond pad structure 700 including a conductive area 740, a first passivation opening 720, and a second passivation opening 730. The conductive area 740 illustrates from a top view the presence of the lower conductive layer 110, the intermediate conductive layer 130, the upper conductive layer 140, and/or the bond pad 710. The first passivation opening 720 illustrates the opening in the passivation layer 150. The second passivation opening 730 illustrates the passivation layer 170 opening.

Figure 9:
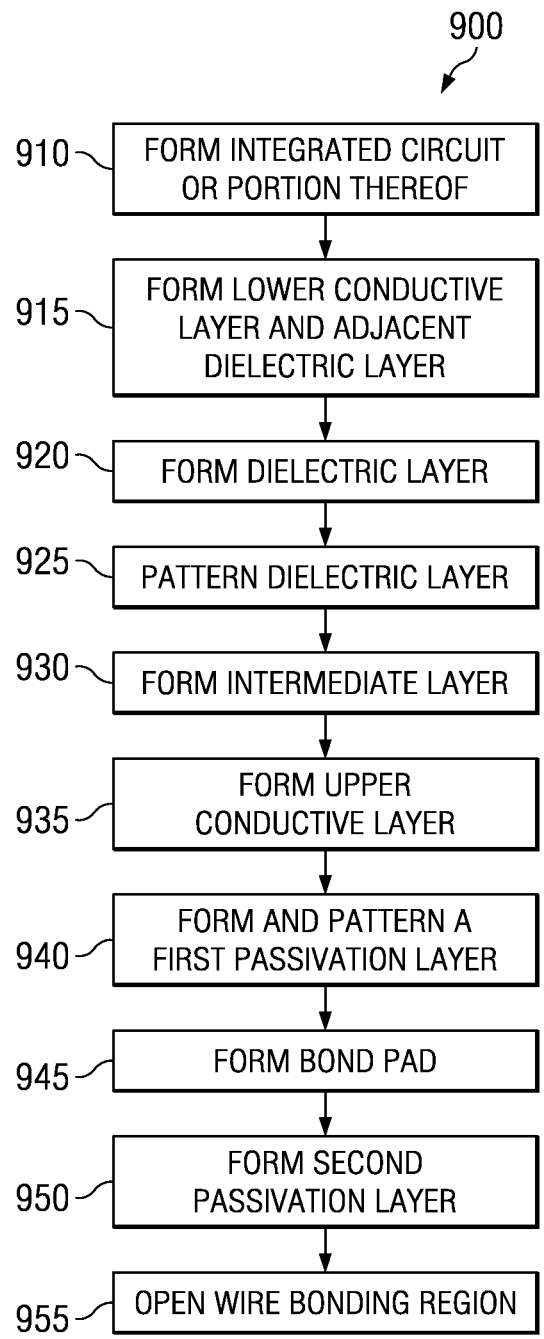
FIG. 9 is a flow chart of an embodiment of a method of fabricating a bond pad structure.

Referring now to FIG. 9, illustrated is a flowchart of one embodiment of a method 900 used to form a bond pad structure. The method 900 may form a bond pad structure such as the bond pad structures 100, 300, 500, 600, and/or 700 described herein. It is understood that additional steps may be provided before, during, and after the method 900, and some of the steps described below can be replaced or eliminated, for additional embodiments of the method. The method 900 begins at step 910 where an integrated circuit or portion thereof is formed, or partially formed, on a substrate. The substrate may be a semiconductor wafer such as silicon wafer. Alternatively, the substrate may include other elementary semiconductor materials such as germanium, a compound semiconductor such as silicon carbide, gallium arsenic, indium arsenide, and indium phosphide, an alloy semiconductor material such as silicon germanium, silicon germanium carbide, gallium arsenic phosphide, and gallium indium phosphide, and/or other substrate compositions known in the art.

The integrated circuit is formed using, for example, conductive layers, semiconductive layers, and insulative layers disposed on the substrate. In one embodiment, a multilayer interconnect (MLI) structure is formed including conductive lines (vias and contacts) and interlayer dielectric (ILD) layers. The formed bond pad structure, described below with reference to step 945, provides electrical contact to devices, including the interconnect structure, from outside of the substrate, e.g., from package terminal. The conductive lines of the interconnect structure may include materials such as aluminum, aluminum/silicon/copper alloy, metal silicide, copper, copper alloy, titanium, titanium nitride, tantalum, tantalum nitride, tungsten, polysilicon, metal silicide (such as, nickel silicide, cobalt silicide, tungsten silicide, tantalum silicide, titanium silicide, platinum silicide, erbium silicide, palladium silicide, or combinations thereof), and/or other suitable materials. The interconnect structure may be formed by processes including physical vapor deposition (or sputtering), chemical vapor deposition (CVD), plating, and/or other suitable processes. Other manufacturing techniques used to form the interconnect structure may include photolithography processing and etching to pattern the materials for vertical (via and contact) and horizontal connects (conductive line), and may be followed by an etchback or chemical mechanical polish (CMP) process. Still other manufacturing processes such as thermal annealing may be used to form metal silicide on the substrate included in the MLI.

The ILD layers of the MLI may include materials such as, silicon oxide, a low dielectric constant such as a dielectric constant less than about 2.5, silicon nitride, silicon oxynitride, polyimide, spin-on glass (SOG), USG, fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layers may be formed by techniques including spin-on, CVD, and/or other suitable processes and may be followed by an etchback or CMP process. The interconnect structure may be formed in an integrated process such as a damascene process or lithography/plasma etching process.

The method 900 then proceeds to step 915 where a lower conductive layer and dielectric layer are formed. The lower conductive layer and dielectric layer may be formed in a manner substantially similar to the interconnect structure, described above with reference to step 910. The lower conductive layer may be substantially similar to the lower conductive layer 110 described above with reference to FIGS. 1-8. The dielectric layer may be substantially similar to the dielectric layer 120 also described above with reference to FIGS. 1-8. In an embodiment, the dielectric layer and the lower conductive layer may be formed simultaneously with a layer of the interconnect structure and/or be a portion of the interconnect structure.

The method 900 then proceeds to step 920 where a dielectric layer is formed. The dielectric layer may be substantially similar to the dielectric layer 125 described above with reference to FIGS. 1, 3, and 7. The dielectric layer may be formed by techniques including spin-on, CVD, or other suitable processes and which may be followed by an etchback or CMP process.

The method 900 then proceeds to step 925 where the dielectric layer formed in step 920 is patterned. The dielectric layer may be patterned using conventional photolithography techniques. The dielectric layer may be patterned such that an intermediate conductive layer may be formed on the lower conductive layer. The patterning may provide for an intermediate conductive layer to be formed to include a solid conductive layer, such as intermediate conductive layer 130, or it may include conductive network and spacer areas such as the intermediate conductive layer 330. In an embodiment, the dielectric layer is patterned to provide vias in the spacer areas. The patterning may be performed using techniques such as photolithography processes including forming photoresist layers, bake processes, exposure processes, development processes; wet or dry etch processes; and/or other suitable processing.

The method 900 then proceeds to step 930 where an intermediate layer may be formed on the patterned dielectric layer. The intermediate layer includes a contiguous, conductive structure(s). In an embodiment, the intermediate layer includes a continuous, conductive structure. The intermediate conductive layer may be substantially similar to the intermediate conductive layer 130 and/or the intermediate layer 330 described above with reference to FIGS. 1-8. Examples of possible configurations of contiguous conductive structures that may be included in the intermediate layer include a solid layer, a matrix configuration(s), a plurality of stripes, and/or other possible configurations.

In an alternative embodiment of the method 900, a solid conductive layer is formed overlying the lower conductive layer. The conductive layer may be etched to form a conductive network and thus removing the conductive layer from the associated spacer areas. A dielectric layer may then be deposited onto the conductive layer and in the associated spacer areas. The dielectric layer may then be etched-back and/or processed using CMP such that the dielectric fills the spacer areas. Any combination of the above processes and/or other processes known in the art may be suitable to form the intermediate conductive layer.

The method 900 then proceeds to step 935 where the upper conductive layer is formed. The upper conductive layer may be substantially similar to the upper conductive layer 140 described above in reference to FIGS. 1, 3, and 7. The upper conductive layer may be formed using processes known in the art such as those described above with reference to forming the interconnect structure of step 910.

The method 900 then proceeds to step 940 where a passivation layer is formed. The passivation layer may be substantially similar to the passivation layer 150 described above with reference to FIGS. 1, 3, and 7. The passivation layer may include silicon oxide, silicon nitride, silicon oxynitride, or combinations thereof. The passivation layer may be formed by CVD, plasma enhanced chemical vapor deposition (PECVD), spin-coating, and/or other suitable techniques. The passivation layer is patterned and etched such that a bond pad may be formed in an opening created in the passivation layer.

The method 900 then proceeds to step 945 where a bond pad is formed. The bond pad may be substantially similar to the bond pad 160 and/or the bond pad 710 described above with reference to FIGS. 1, 3, and 7. The bond pad may include a plurality of layers including, for example, barrier layers. The bond pad may be formed using deposition techniques such as, sputtering, CVD, plating, and/or other suitable processes. In an embodiment, the bond pad includes aluminum. Examples of other materials that may be included in the bond pad are titanium, tantalum, copper, tungsten, combinations thereof including alloys, and/or other suitable conductive materials.

The method 900 then proceeds to step 950 where an additional passivation layer is formed. The passivation layer may be substantially similar to the passivation layer 170 described above with reference to FIGS. 1, 3, and 7. The passivation layer may include material compositions and/or be formed in a manner substantially similar to the passivation layer formed in step 940.

The method 900 then proceeds to step 955 where the passivation layer formed in step 955 is opened to expose the bond pad and provide for a bonding region. The passivation layer may be patterned to provide an opening using a series of processing steps including photolithography and etching as known in the art.

The method 900 may continue to an electrical test procedure (e.g., probe test) where contact is made to the exposed bonding pad(s) by the testing probes for various electrical evaluations. The method 900 may also continue to provide for an integrated circuit (e.g., die) to be wired to a chip package using various wire bonding techniques such as thermocompression bonding or thermosonic bonding, resulting in a ball or wedge bond at the formed bond pad. Other bonding techniques may be alternatively utilized (e.g., placement of a bump for flip chip packaging).

Thus, the present disclosure provides a device including a first conductive layer; a second conductive layer on the first conductive layer; and a bond pad on the second conductive layer. A connective layer interposes the first and second conductive layer. The connective layer includes a contiguous, conductive structure. In an embodiment, the connective layer is entirely conductive material (e.g., a conductive pad or solid layer). In an embodiment, the contiguous conductive structure includes a matrix configuration of conductive material. At least one spacer may interpose the contiguous conductive structure (e.g., the matrix). In an embodiment, the spacer includes dielectric material. In a further embodiment, a plurality of conductive plugs is formed in the spacer. In an embodiment, a continuous conductive structure is provided and one or more spacers may interpose the continuous conductive structure.

The present disclosure also provides a device including a substrate; a first conductive layer formed on the substrate; and a second conductive layer formed on the first conductive layer. An intermediate layer interposes and electrically couples the first and second conductive layers. The conductive density of the intermediate layer is greater than approximately 20%. The intermediate layer includes a continuous structure of conductive material. In an embodiment, the continuous structure may be a matrix. In an embodiment, the conductive density of the intermediate layer is between 20 and 100%.

A method of forming a bond pad structure is also provided. The method includes forming a first conductive layer and forming a second conductive layer on the first conductive layer. A connecting layer is formed between the first and second conductive layer and electrically couples the first and second conductive layers. Forming the connecting layer includes forming a contiguous conductive structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   forming a first conductive layer disposed over a substrate;
   depositing a first dielectric layer over the first conductive layer;
   patterning the first dielectric layer to form a contiguous planar path substantially parallel to a top surface of the substrate, wherein the patterning includes:
      defining a first dielectric region of the first dielectric layer surrounded by the contiguous planar path;
      defining a second dielectric region of the first dielectric layer surrounded by the contiguous planar path, wherein the first and second dielectric regions are separated by the contiguous planar path; and
      forming a first via hole in the first dielectric region;
   filling the contiguous planar path and the first via hole with a conductive material, wherein the conductive material in the contiguous planar path forms a second conductive layer, wherein the contiguous planar path extends from a first lateral side wall of the second conductive layer to a second lateral sidewall of the second conductive layer; and
   forming a bond pad over the second conductive layer, wherein the bond pad is electrically connected to the second conductive layer.

2. The method of claim 1, further comprising
   forming a third conductive layer over the second conductive layer and under the bond pad, wherein the third conductive layer is electrically connected to the first conductive layer, wherein the contiguous planar path of the conductive material physically contacts at least one of the first conductive layer and the third conductive layer.

3. The method of claim 1, further comprising
   forming conductive plugs electrically coupling the bond pad to the second conductive layer.

4. The method of claim 1, wherein the first and second dielectric regions and the second conductive layer including the contiguous planar path of the conductive material considered together has a conductive density of greater than approximately 20%.

5. The method of claim 1, further comprising
   forming a second via hole in the second dielectric region; and
   filling the second via hole with the conductive material.

6. The method of claim 1, wherein the filled first via hole of the conductive material is electrically coupled to the bond pad and the first conductive layer.

7. The method of claim 1, further comprising forming a passivation layer adjacent the bond pad, wherein the passivation layer has an opening exposing a surface of the bond pad.

8. A method of fabricating a semiconductor device, comprising:
   forming a first conductive layer over a substrate;
   forming an intermediate layer of a conductive density greater than approximately 20%, wherein the forming the intermediate layer comprises:
      depositing a dielectric layer on the first conductive layer;
      patterning the dielectric layer to form a contiguous planar path within the dielectric layer and a plurality of spacers, wherein the spacers are separated by the contiguous planar path, and wherein the spacers include a dielectric material;
      forming a via hole in each spacer; and
      filling the contiguous planar path and the via holes with a conductive material, wherein the contiguous planar path of the conductive material forms an intermediate conductive layer, wherein the contiguous planar path of the conductive material extends from a first point on a first lateral sidewall of the intermediate conductive layer to a second point on a second lateral sidewall of the intermediate conductive layer, wherein a first point on the contiguous planar path of the conductive material contacts the first conductive layer;
   depositing a second conductive layer over the intermediate layer, wherein a second point on the contiguous planar path of the conductive material contacts the second conductive layer; and forming a bond pad over the second conductive layer, wherein the bond pad provides an electrical connection from a package terminal to an integrated circuit device on the substrate.

9. The method of claim 8, further comprising:
forming conductive plugs connecting to the second conductive layer.

10. The method of claim 8, wherein the forming the intermediate layer provides the intermediate layer having a conductive density of approximately 100%.

11. The method of claim 8, wherein the contiguous planar path of the conductive material is a continuous structure.

12. The method of claim 8, further comprising:
forming conductive plugs coupling the bond pad and the intermediate layer.

13. The method of the claim 8, further comprising
forming a passivation layer adjacent the bond pad, wherein the passivation layer has an opening exposing a surface of the bond pad.

14. A method of forming a bond pad structure, comprising:
forming a first conductive layer and a second conductive layer of a conductive material over the first conductive layer;
etching the second conductive layer to form a contiguous network structure of the conductive material and a first via of the conductive material, wherein the contiguous network structure of the conductive material has a planar top surface that extends from a first sidewall to an opposing second sidewall of the contiguous network structure, wherein the etching the second conductive layer comprises:
defining a first spacer area having a first enclosing boundary and a second spacer area having a second enclosing boundary different from the first enclosing boundary, wherein each of the first and second enclosing boundaries are defined by the contiguous network structure, wherein the first via is disposed in the first spacer area; and
filling the first spacer area and second spacer area with a dielectric material;
forming a third conductive layer over the second conductive layer; and
forming a bond pad over the third conductive layer, wherein the bond pad is electrically connected to the third conductive layer.

15. The method of claim 14, further comprising:
disposing a wire bond on the bond pad wherein the wire bond provides an electrical connection between the bond pad and a package terminal.

16. The method of claim 14, further comprising:
forming a passivation layer adjacent the bond pad, wherein the passivation layer has an opening exposing a surface of the bond pad.

17. The method of claim 14,
wherein a second via of the conductive material is disposed in the second spacer area.

18. The method of claim 14, wherein the first via of the conductive material is electrically coupled to the bond pad and the first conductive layer.

19. The method of claim 14, wherein the etching the second conductive layer further comprises: forming a second via in the first spacer area.

20. The method of claim 8, wherein after the filling the contiguous planar path with a conductive material, sidewalls of each of the plurality of spacers physically contact the contiguous planar path of the conductive material.

* * * * *